United States Patent
Kim et al.

(10) Patent No.: US 8,198,704 B2
(45) Date of Patent: Jun. 12, 2012

(54) SEMICONDUCTOR DEVICE INCLUDING A CRYSTAL SEMICONDUCTOR LAYER

(75) Inventors: Sung-Min Kim, Inheon (KR); Eun-Jung Yun, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 179 days.

(21) Appl. No.: 12/710,378

(22) Filed: Feb. 23, 2010

(65) Prior Publication Data

US 2010/0148260 A1    Jun. 17, 2010

Related U.S. Application Data

(62) Division of application No. 11/561,151, filed on Nov. 17, 2006, now Pat. No. 7,696,032.

(30) Foreign Application Priority Data

Nov. 18, 2005 (KR) ................ 2005-110986

(51) Int. Cl.
*H01L 29/06* (2006.01)
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ........ 257/618; 257/328; 257/331; 257/401; 257/623; 257/E21.205; 257/E21.624; 257/E21.638

(58) Field of Classification Search .......... 257/328, 257/331, 401, 618, 623, E21.205, E21.624, 257/E21.638

See application file for complete search history.

(56) References Cited

U.S. PATENT DOCUMENTS

| | | | | |
|---|---|---|---|---|
| 3,906,541 A * | 9/1975 | Goronkin | ........... | 257/283 |
| 4,648,173 A * | 3/1987 | Malaviya | ........... | 438/151 |
| 5,302,843 A * | 4/1994 | Yamazaki | ........... | 257/296 |
| 5,414,287 A * | 5/1995 | Hong | ........... | 257/316 |
| 5,466,961 A * | 11/1995 | Kikuchi et al. | ........... | 257/379 |
| 5,488,236 A * | 1/1996 | Baliga et al. | ........... | 257/132 |
| 5,567,550 A | 10/1996 | Smayling | | |
| 5,581,100 A * | 12/1996 | Ajit | ........... | 257/331 |
| 5,633,519 A * | 5/1997 | Yamazaki et al. | ........... | 257/315 |
| 6,066,547 A | 5/2000 | Maekawa | | |
| 6,157,061 A * | 12/2000 | Kawata | ........... | 257/316 |
| 6,157,069 A * | 12/2000 | Shin et al. | ........... | 257/390 |

(Continued)

FOREIGN PATENT DOCUMENTS

JP    06-310427    11/1994

(Continued)

*Primary Examiner* — Ida M Soward
(74) *Attorney, Agent, or Firm* — Volentine & Whitt, PLLC

(57) ABSTRACT

In one embodiment, a method of fabricating a semiconductor device having a crystalline semiconductor layer includes preparing a semiconductor substrate and forming a preliminary active pattern on the semiconductor substrate. The preliminary active pattern includes a barrier pattern and a non-single crystal semiconductor pattern. A sacrificial non-single crystal semiconductor layer covers the preliminary active pattern and the semiconductor substrate. By crystallizing the sacrificial non-single crystal semiconductor layer and the non-single crystal semiconductor pattern, using the semiconductor substrate as a seed layer, the sacrificial non-single crystal semiconductor layer and the non-single crystal semiconductor pattern are changed to a sacrificial crystalline semiconductor layer and a crystalline semiconductor pattern, respectively. The crystalline semiconductor pattern and the barrier pattern constitute an active pattern. The sacrificial crystalline semiconductor layer is removed.

12 Claims, 8 Drawing Sheets

U.S. PATENT DOCUMENTS

| | | | |
|---|---|---|---|
| 6,309,930 B1 * | 10/2001 | Goebel et al. | 438/270 |
| 6,373,099 B1 * | 4/2002 | Kikuchi et al. | 257/331 |
| 6,387,779 B1 | 5/2002 | Yi et al. | |
| 6,538,925 B2 * | 3/2003 | Miida | 365/185.28 |
| 6,558,986 B1 | 5/2003 | Choi | |
| 6,602,758 B2 | 8/2003 | Kizilyalli et al. | |
| 6,661,036 B1 * | 12/2003 | Sittig et al. | 257/124 |
| 6,692,996 B2 | 2/2004 | Lee et al. | |
| 6,773,994 B2 * | 8/2004 | Chittipeddi et al. | 438/268 |
| 7,119,384 B2 * | 10/2006 | Popp et al. | 257/250 |
| 7,148,541 B2 * | 12/2006 | Park et al. | 257/347 |
| 7,172,943 B2 * | 2/2007 | Yeo et al. | 438/300 |
| 7,390,705 B2 | 6/2008 | Paik | |
| 7,445,997 B2 * | 11/2008 | Lee et al. | 438/260 |
| 7,498,243 B2 | 3/2009 | Liu et al. | |
| 2002/0179970 A1 * | 12/2002 | Yagishita et al. | 257/350 |
| 2007/0075351 A1 * | 4/2007 | Schulz et al. | 257/314 |
| 2007/0111448 A1 * | 5/2007 | Li et al. | 438/264 |
| 2009/0155979 A1 | 6/2009 | Son et al. | |
| 2011/0180851 A1 * | 7/2011 | Doyle et al. | 257/192 |

FOREIGN PATENT DOCUMENTS

| | | |
|---|---|---|
| JP | 09-330879 | 12/1997 |
| KR | 1993-0070239 | 9/2009 |

* cited by examiner

SEMICONDUCTOR DEVICE INCLUDING A CRYSTAL SEMICONDUCTOR LAYER

CROSS-REFERENCE TO RELATED APPLICATION

This application is a Divisional of application Ser. No. 11/561,151, filed Nov. 17, 2006, which claims priority from Korean Patent Application No. 2005-0110986, filed Nov. 18, 2005, the disclosure of which is hereby incorporated herein by reference in its entirety as if set forth fully herein.

BACKGROUND OF INVENTION

1. Technical Field

The present invention relates to a semiconductor device, a fabricating method thereof, and an operating method thereof, and more particularly, to a semiconductor device having a crystalline semiconductor layer, a fabricating method thereof, and an operating method thereof.

2. Discussion of the Related Art

With a highly integrated semiconductor device, channel lengths of transistors and distances, such as between transistors, are small. And as integration increases, those sizes and distances become smaller. Also, one will find with recent trends that concentrations of impurities in semiconductor substrates have increased, and thus, source/drain junction capacitances of transistors and leakage currents have increased. Consequently, the trends result in a deterioration of many other characteristics of semiconductor devices, such as high speed, low power consumption, and the like, though these properties continue to be in increasing demand.

A silicon-on-insulator (SOI) substrate is gaining attention to solve these problems. Particularly, the SOI is less susceptible to a latch up phenomenon caused by an inner feed-back phenomenon that occurs in a CMOS structure with high integration density.

The SOI substrate has a single crystal silicon layer formed on a buried insulating layer unlike a bulk silicon substrate, and an element such as a transistor is formed on the single crystal silicon layer. Generally, fabrication of the SOI substrate may be divided into two methods. A first method is a separation by implanted oxygen (SIMOX) method, in which oxygen atoms are implanted into a silicon substrate so that the oxygen atoms penetrate deep into the substrate by a predetermined depth, and an annealing process is performed to form a buried insulating layer. A second method is to form an insulating layer on a substrate and attach substrates to each other, and perform an etch-back process on the substrates.

A main drawback, however, of the first method is that its processes are complicated and inconvenient because a LOCOS process or an STI process must be performed to form an isolation layer after oxygen ions are implanted into a silicon substrate, and a thermal treatment process is performed. Furthermore, serious defects may be generated inside the semiconductor substrate on which elements will be formed. In the second method, however, since two substrates having an insulating layer formed thereon are attached at a high temperature, and one side of the substrates is polished, it is required to perform a thermal treatment process at a high temperature, and voids may be generated at the junction portion of the substrates.

Recently, as one of the efforts to solve these problems, a method of fabricating an SOI substrate is disclosed in U.S. Pat. No. 6,602,758 B2 in the title of "Formation of Silicon On Insulator Devices as Add-On Modules for System On a Chip Processing" to Kizilyalli, et al. According to Kizilyalli, et al., an insulating layer is formed on a semiconductor substrate, and the insulating layer is patterned, thereby forming an opening exposing the semiconductor substrate. An amorphous silicon layer is formed on the patterned insulating layer to contact the exposed semiconductor substrate, and an eximer laser is applied to crystallize the amorphous silicon layer. As a result, a silicon layer having substantially the same single crystal structure as that of the semiconductor substrate is formed.

However, a continuous effort is required to fabricate an improved semiconductor device using a crystalline semiconductor layer formed on the semiconductor substrate as well as to form the SOI substrate.

SUMMARY

Therefore, some embodiments of the present invention are directed to providing a semiconductor device and a method of its fabrication capable of forming a semiconductor layer having the substantially same crystal structure as that of a semiconductor substrate on the semiconductor substrate, and interposing various barrier layers between the semiconductor substrate and the semiconductor layer.

Another embodiment of the present invention is to provide a method of operating a semiconductor device having the semiconductor substrate, the semiconductor layer, and the barrier layer interposed between the semiconductor substrate and the semiconductor layer.

In accordance with an exemplary embodiment, the present invention provides a method of fabricating a semiconductor device having a crystalline semiconductor layer. The method comprises preparing a semiconductor substrate and forming a preliminary active pattern on the semiconductor substrate. The preliminary active pattern comprises a barrier pattern and a non-single crystal semiconductor pattern, which may be alternately stacked at least one time. A sacrificial non-single crystal semiconductor layer is formed to cover the preliminary active pattern and the semiconductor substrate. By crystallizing the sacrificial non-single crystal semiconductor layer and the non-single crystal semiconductor pattern, using the semiconductor substrate as a seed layer, the sacrificial non-single crystal semiconductor layer and the non-single crystal semiconductor pattern are changed to a sacrificial crystalline semiconductor layer and a crystalline semiconductor pattern respectively. The crystalline semiconductor pattern and the barrier pattern constitute an active pattern. The sacrificial crystalline semiconductor layer is preferably removed.

The semiconductor substrate may be a single crystal semiconductor substrate.

Forming the preliminary active pattern may comprise sequentially forming a barrier layer and a non-single crystal semiconductor layer on the semiconductor substrate, and patterning the non-single crystal semiconductor layer and the barrier layer.

The preliminary active pattern may be formed to further comprise a semiconductor pattern below the barrier pattern. In this case, forming of the preliminary active pattern may comprise sequentially forming a barrier layer and a non-single crystal semiconductor layer on the semiconductor substrate, patterning the non-single crystal semiconductor layer and the barrier layer to expose a predetermined portion of the semiconductor substrate, and etching the exposed semiconductor substrate by a predetermined depth.

After removing the sacrificial crystalline semiconductor layer, the method may further comprise forming a gate pattern crossing the active pattern. The gate pattern may be formed to comprise a gate insulating layer and a gate electrode, which are sequentially stacked.

The insulating pattern may be formed thinner than the gate insulating layer.

Before forming the gate pattern, the method may further comprise forming an isolation layer covering the semiconductor substrate around the active pattern.

Source/drain may be formed inside the active pattern at both sides of the gate pattern.

The barrier pattern may be formed to comprise a metal pattern.

The sacrificial crystalline semiconductor layer may have an etch selectivity with respect to the crystalline semiconductor pattern.

When the crystalline semiconductor pattern comprises a silicon layer, the sacrificial crystalline semiconductor layer may be formed of a silicon germanium layer.

In another aspect of the present invention, the present invention provides a semiconductor device having a crystalline semiconductor layer. The semiconductor device comprises a semiconductor substrate, and an active pattern disposed on the semiconductor substrate. The active pattern comprises a barrier pattern and a crystalline semiconductor pattern, which are alternately stacked at least one time, the crystalline semiconductor pattern having substantially the same crystal structure as that of the semiconductor substrate.

The semiconductor substrate may be a single crystal semiconductor substrate.

The active pattern may further comprise a semiconductor pattern disposed between the barrier pattern and the semiconductor substrate. The semiconductor pattern may be relatively protruded from the semiconductor substrate.

Further, a gate pattern crossing the active pattern may be formed, and source/drain may be formed inside the active pattern at both sides of the gate pattern. The gate pattern may comprise a gate insulating layer and a gate electrode.

In another aspect of the present invention, the present invention provides a method of operating a one-transistor memory device. The method comprises preparing a One-transistor memory device comprising a semiconductor substrate, an active pattern including a barrier pattern and a crystalline semiconductor pattern having substantially the same crystal structure as that of the semiconductor substrate sequentially stacked on the semiconductor substrate, a gate insulating layer covering the active pattern, a gate electrode disposed on the gate insulating layer and crossing the active pattern, and a source and a drain formed inside the active pattern at both sides of the gate electrode. A write voltage is applied between the semiconductor substrate and the gate electrode, thereby implanting carriers from the semiconductor substrate into the crystalline semiconductor pattern.

The method may further comprise applying a read voltage between the source and the drain, thereby reading out data stored inside the one-transistor memory cell.

The barrier pattern may be a tunnel insulating layer.

The barrier pattern may be thinner than that of the gate insulating layer.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION

Figure 1:
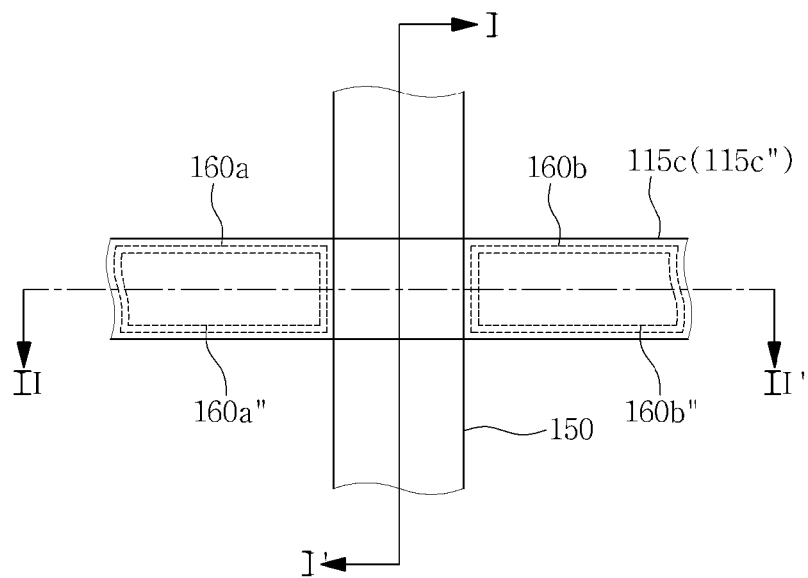
FIG. 1 is a plan view illustrating a semiconductor device according to an embodiment of the present invention.

The present invention will now be described more fully hereinafter with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout the specification.

FIG. 1 is a plan view illustrating a semiconductor device according to an embodiment of the present invention, and FIGS. 2 through 7 are cross-sectional views taken along line I-I' of FIG. 1 illustrating a method of fabricating a semiconductor device according to some embodiments of the present invention.

Figure 2:
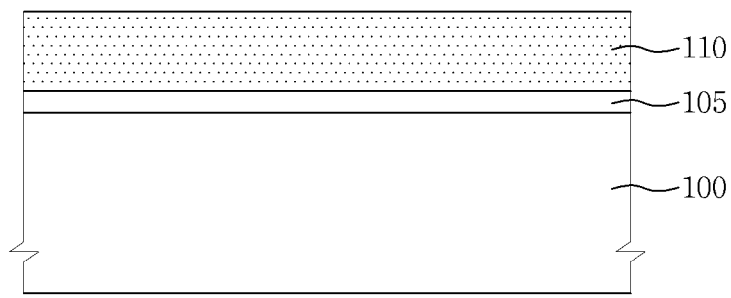
FIGS. 2 through 7 are cross-sectional views taken along line I-I' of FIG. 1 illustrating a method of fabricating a semiconductor device according to embodiments of the present invention.

Referring to FIGS. 1 and 2, a semiconductor substrate 100 is prepared. The semiconductor substrate 100 may have a single crystalline structure. The semiconductor substrate 100 may be, for example, a silicon substrate, a germanium substrate, a silicon germanium substrate, or a silicon carbide substrate. A barrier layer 105 and a non-single crystal semiconductor layer 110 are sequentially formed on the overall surface of the semiconductor substrate 100. The non-single crystal semiconductor layer 110 may be formed of a silicon layer, a germanium layer, a silicon germanium layer, or a silicon carbide layer.

Herein, the "non-single crystal semiconductor layer" may be in an amorphous state. The "non-single crystal semiconductor layer" can contain some proportion of microcrystalline or polycrystalline material.

The barrier layer 105 may be an insulating layer. The insulating layer may include, for example, a silicon oxide layer, a silicon nitride layer, an oxide/nitride/oxide (ONO) layer, or a high-k dielectric layer. The barrier layer 105 and the non-single crystal semiconductor layer 110 may be stacked alternately at least one time. The barrier layer 105 may have different functions depending on its kind and formation thickness.

For example, when the barrier layer 105 comprises silicon oxide, the barrier layer 105 may function as a buried insulating layer of a silicon on insulator (SOI) substrate. On the other hand, the barrier layer 105 may also function as a tunnel insulating layer. In this case, the barrier layer 105 may be formed relatively thin. According to some embodiments of the present invention, since the thickness of the barrier layer 105 is easy to control, the thickness of the barrier layer 105 may be formed less than that of a buried insulating layer of a conventional SOI substrate. For example, the barrier layer 105 may be formed with a thickness of about 100 Å or less.

When the barrier layer 105 comprises an ONO layer or a high-k dielectric layer in other embodiments, the barrier layer 105 may function as a tunnel insulating layer. In the meantime, when the barrier layer 105 comprises silicon nitride in other embodiments, the barrier layer 105 may function as a charge storage layer.

Figure 3:
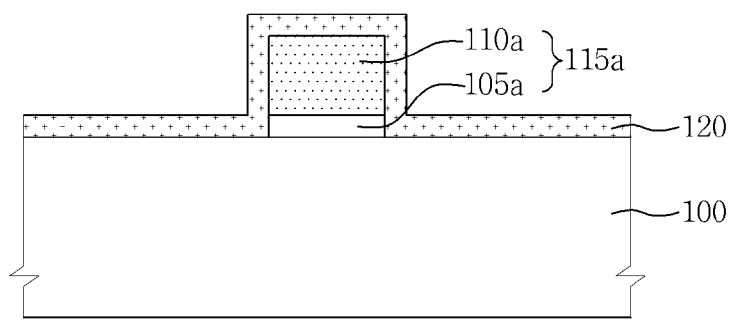

Referring to FIGS. 1 and 3, the non-single crystal semiconductor layer 110 and the barrier layer 105 are patterned, thereby forming a preliminary active pattern 115a including a barrier pattern 105a and a non-single crystal semiconductor pattern 110a, which are sequentially stacked. From a plan view, the preliminary active pattern 115a may be formed with a line shape or an island shape.

A sacrificial non-single crystal semiconductor layer 120 is formed to cover the preliminary active pattern 115a and the semiconductor substrate 100. The sacrificial non-single crystal semiconductor layer 120 may comprise a material having an etch selectivity with respect to the semiconductor substrate 100 and the non-single crystal semiconductor pattern 110a. For example, when the semiconductor substrate 100 and the non-single crystal semiconductor pattern 110a comprise silicon, the sacrificial non-single crystal semiconductor layer 120 may comprise silicon germanium.

Figure 4:
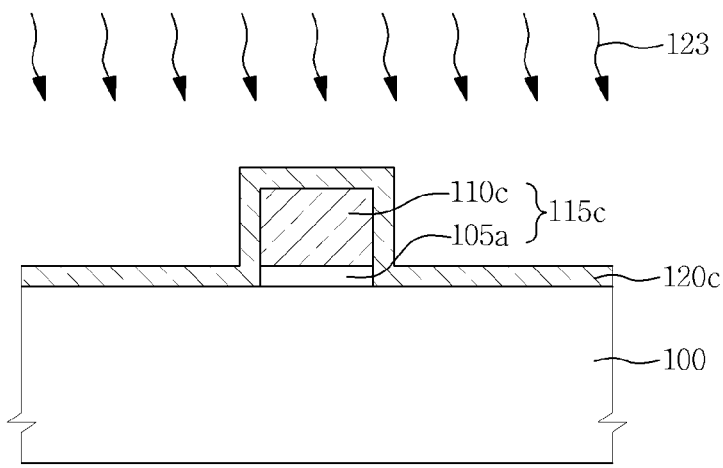

Referring to FIGS. 1 and 4, the sacrificial non-single crystal semiconductor layer 120 and the non-single crystal semiconductor pattern 110a are crystallized using the semiconductor substrate 100 as a seed layer. The sacrificial non-single crystal semiconductor layer 120 and the non-single crystal semiconductor pattern 110a can be crystallized using, for example, a solid phase epitaxial (SPE) technology. The crystallization process may include a thermal treatment indicated as an arrow 123 (FIG. 4) using a laser beam. During the thermal treatment 123, the non-single crystal semiconductor pattern 110a and the sacrificial non-single crystal semiconductor layer 120 are changed to a crystalline semiconductor pattern 110c and a sacrificial crystalline semiconductor layer 120c respectively. The sacrificial non-single crystal semiconductor layer 120 is crystallized to have substantially the same crystal structure as that of the material layer in contact with the sacrificial non-single crystal semiconductor layer 120 during the thermal treatment 123. That is, when the semiconductor substrate 100 has a single crystal structure, the sacrificial non-single crystal semiconductor layer 120 is crystallized to have substantially the same crystal structure as that of the semiconductor substrate 100, namely, a single crystal structure. Similarly, since the non-single crystal semiconductor pattern 110a is covered with the sacrificial crystalline semiconductor layer 120c, the non-single crystal semiconductor pattern 110a is changed to the crystalline semiconductor pattern 110c having substantially the same crystal structure as that of the sacrificial crystalline semiconductor layer 120c during the thermal treatment 123. For example, when the sacrificial crystalline semiconductor layer 120c has a single crystal structure, the non-single crystal semiconductor pattern 110a is also crystallized to have a single crystal structure. As a result, the non-single crystal semiconductor pattern 110a is crystallized to have substantially the same crystal structure as that of the semiconductor substrate 100 through the sacrificial non-single crystal semiconductor layer 120. The crystalline semiconductor pattern 110c and the barrier pattern 105a disposed therebelow constitute an active pattern 115c. That is, the preliminary active pattern 115a is changed to the active pattern 115c after the thermal treatment 123.

Figure 5:
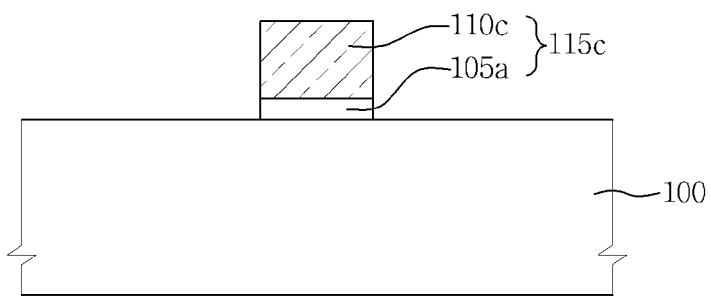

Referring to FIGS. 1 and 5, the sacrificial crystalline semiconductor layer 120c is removed. The sacrificial crystalline semiconductor layer 120c may be selectively removed, using an isotropic etch process. Alternatively, the sacrificial crystalline semiconductor layer 120c may be removed employing an etch process using an etch selectivity. For example, when the semiconductor substrate 100 and the crystalline semiconductor pattern 110c comprise silicon, and the sacrificial crystalline semiconductor layer 120c comprises silicon germanium, the sacrificial crystalline semiconductor layer 120c can be selectively removed using an etchant selectively removing the silicon germanium.

Figure 6:
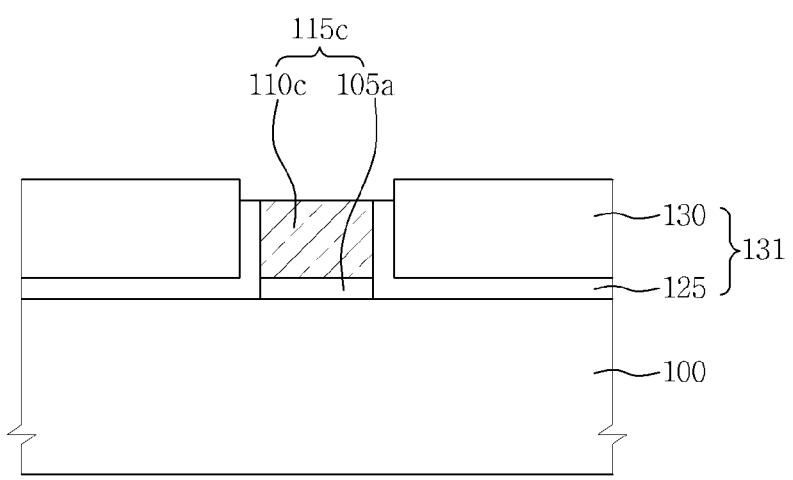

Referring to FIGS. 1 and 6, a planarized isolation layer 131 is formed on the semiconductor substrate 100 having the active pattern 115c. The formation of the isolation layer 131 may include forming an isolation insulating layer 130, for example, a silicon oxide layer on the overall surface of the semiconductor substrate 100 having the active pattern 115c, and planarizing the isolation insulating layer 130 to expose the active pattern 115c. Before the isolation insulating layer 130 is formed, a liner insulating layer 125 such as a silicon nitride layer may be formed. When the liner insulating layer 125 is formed before the isolation insulating layer 130 is formed, the method may further include processes of planarizing the isolation insulating layer 130 and selectively removing the liner insulating layer 125 remained on the active pattern 115c.

In other embodiments, the isolation layer 131 may be formed so that its upper surface is on substantially the same plane as an upper surface of the active pattern 115c, or may be formed to have a lower level or higher level than the level of the upper surface of the active pattern 115c. When the upper surface of the isolation layer 131 is lower than the upper surface of the active pattern 115c, sidewalls of the active pattern 115c as well as the upper surface thereof are partially exposed, thereby forming a fin-shaped active pattern 115c.

Figure 7:
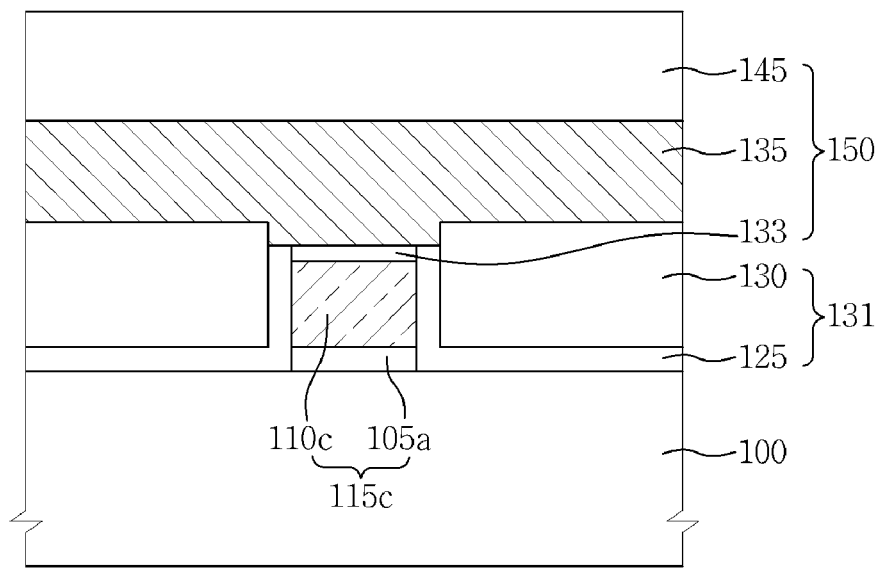

Referring to FIGS. 1 and 7, a gate pattern 150 is formed to cross the active pattern 115c. The gate pattern 150 may be formed to include a gate insulating layer 133 formed on the active pattern 115c, a gate electrode 135 crossing the active pattern 115c, and a gate capping pattern 145 disposed on the gate electrode 135. A source 160a and a drain 160b are formed inside the active pattern 115c on both sides of the gate pattern 150. Specifically, the source 160a and the drain 160b may be formed inside the crystalline semiconductor pattern 110c.

Figure 8:
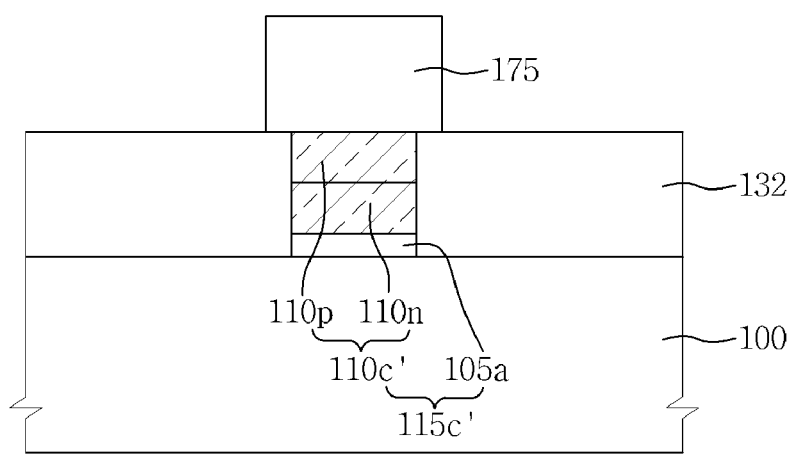
FIG. 8 is a cross-sectional view illustrating a method of fabricating a semiconductor device according to another embodiment of the present invention.

FIG. 8 is a cross-sectional view illustrating a method of fabricating a semiconductor device according to another embodiment of the present invention.

Referring to FIG. 8, an active pattern 115c' including a barrier pattern 105a and a crystalline semiconductor pattern 110c' is formed on a semiconductor substrate 100 by the same or similar method as described with reference to FIGS. 2 through 5. The barrier pattern 105a may be a metal pattern unlike the embodiment illustrated in FIG. 7. The metal pattern may be a metal pattern not influenced by a thermal treatment 123 to form the crystalline semiconductor pattern 110c'. That is, when the thermal treatment 123 is performed using a laser and at a temperature of about 600.degree. C., the metal pattern is preferably a metal pattern having a melting point higher than about 600.degree. C. The metal pattern may function as a word line or a bit line.

An insulating layer is formed on the overall surface of the semiconductor substrate 100 having the active pattern 115c', and the insulating layer is planarized to expose the active pattern 115c', thereby forming an insulating interlayer 132. Then, n-type impurity ions are implanted into a lower portion of the crystalline semiconductor pattern 110c', using the insulating interlayer 132 as an ion implantation mask, thereby forming an n-type semiconductor pattern 110n contacting the barrier pattern 105a. Then, p-type impurity ions are implanted into an upper portion of the crystalline semiconductor pattern 110c', thereby forming a p-type semiconductor pattern 110p on the n-type semiconductor pattern 110n. As a result, the crystalline semiconductor pattern 110c' may function as a diode.

Then, a data storage element 175 may be formed to be in contact with the p-type semiconductor pattern 110p. The data storage element 175 may include a phase change material pattern or a magnetic tunnel junction structure. In this case, the barrier pattern 105a may function as a word line.

Figure 11:
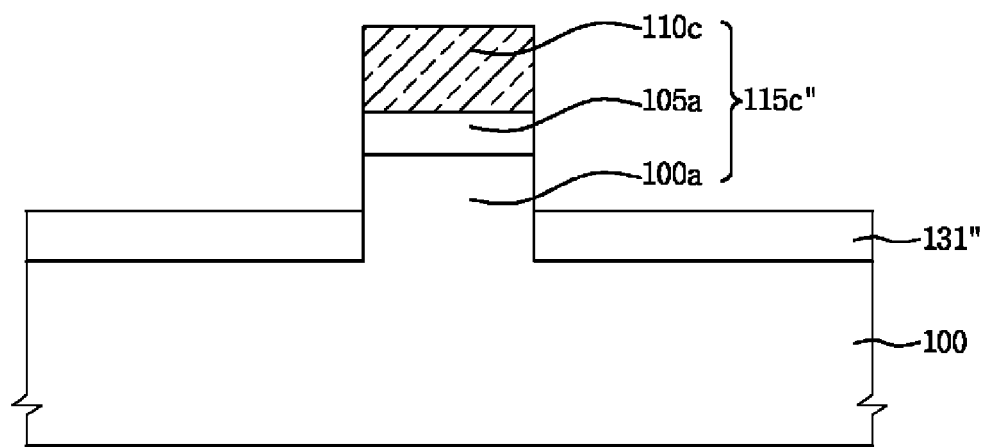
Figure 12:
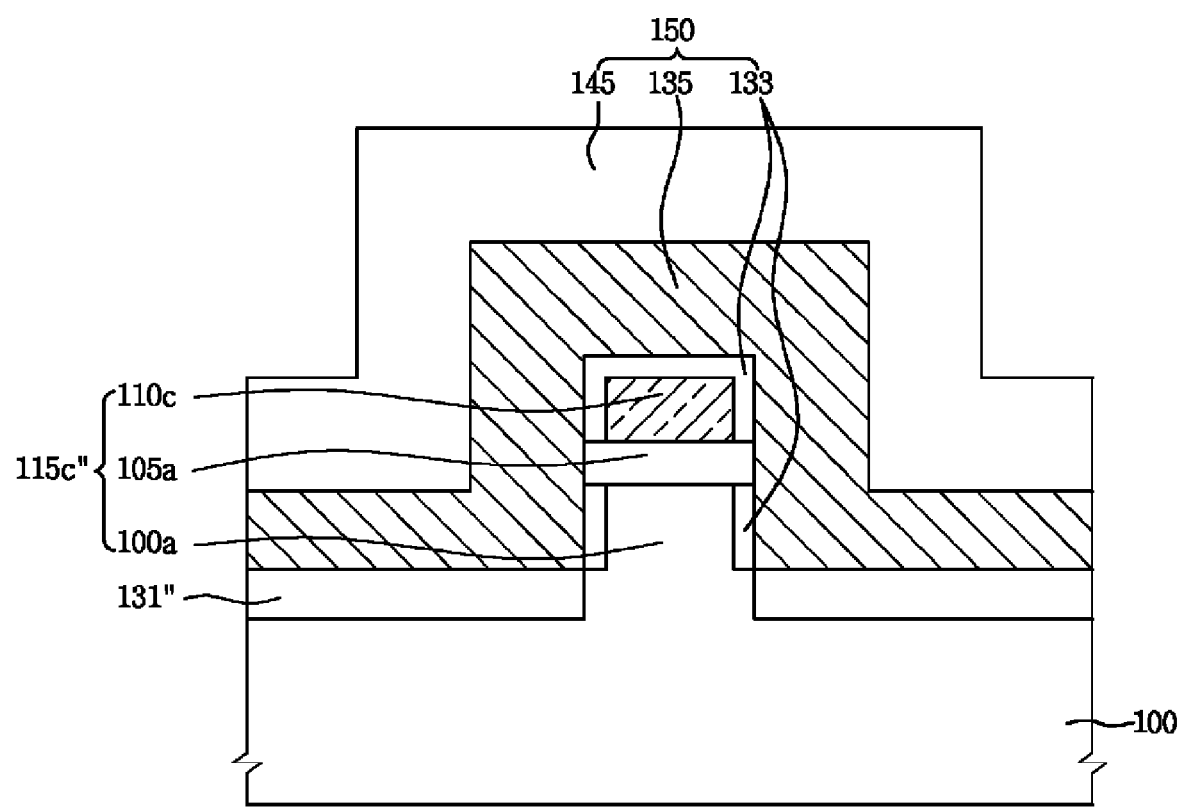
Figure 13:
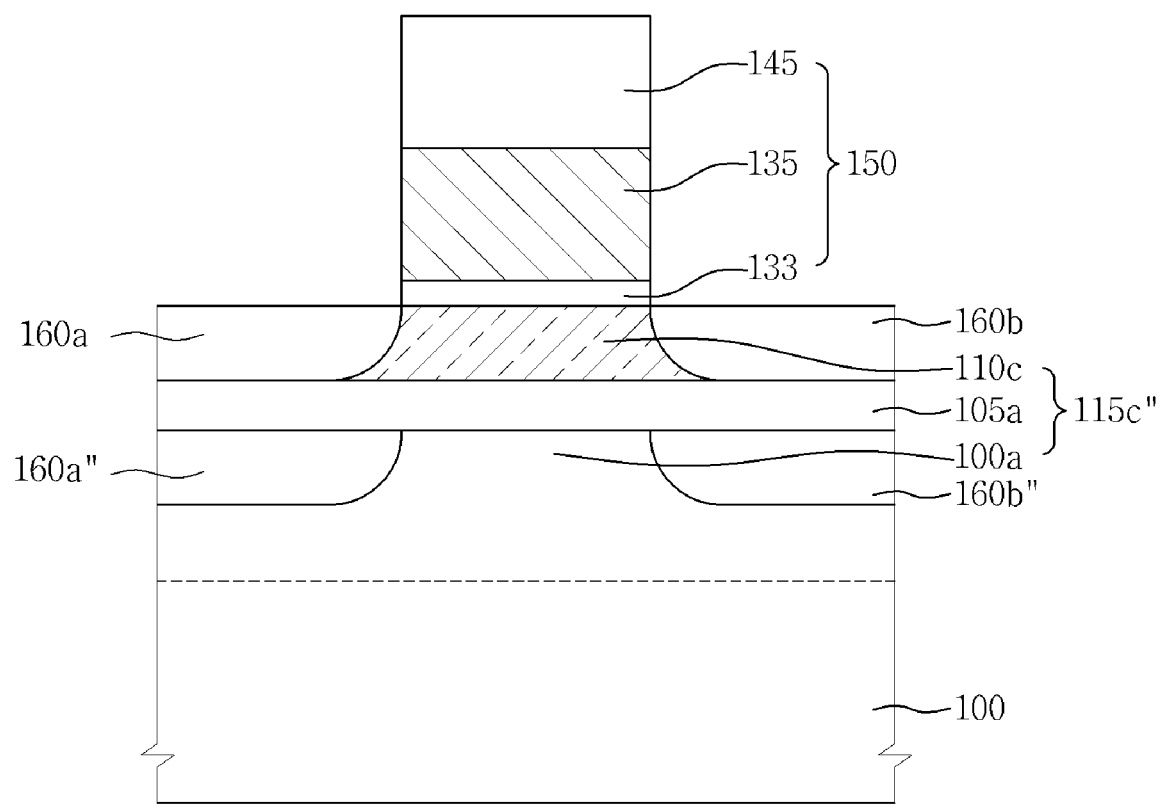
FIG. 13 is a cross-sectional view taken along line II-II' of FIG. 1 illustrating a method of fabricating a semiconductor device according to still other embodiments of the present invention.

FIGS. 9 through 12 are cross-sectional views taken along line I-I' of FIG. 1 illustrating a method of fabricating a semiconductor device according to yet another embodiment of the present invention, and FIG. 13 is a cross-sectional view taken along line II-II' of FIG. 1.

Figure 9:
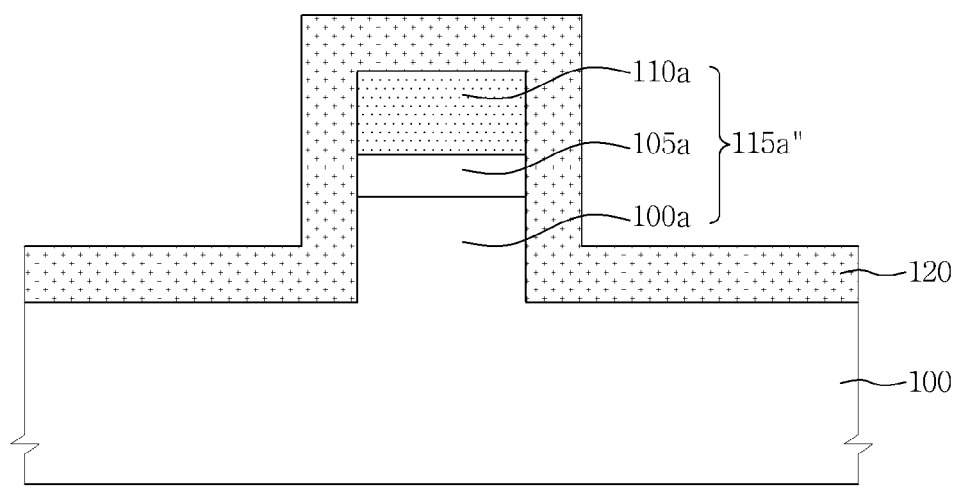
FIGS. 9 through 12 are cross-sectional views taken along line I-I' of FIG. 1 illustrating a method of fabricating a semiconductor device according to yet another embodiments of the present invention.

Referring to FIGS. 1 and 9, a barrier layer 105 and a non-single crystal semiconductor layer 110 are sequentially formed on the overall surface of the semiconductor substrate 100, using the same method as described in reference to FIG. 2. The barrier layer 105 may be an insulating layer.

The non-single crystal semiconductor layer 110 and the barrier layer 105 are patterned, thereby forming a barrier pattern 105a and a non-single crystal semiconductor pattern 110a, which are sequentially stacked, while exposing a predetermined portion of the semiconductor substrate 100. The exposed semiconductor substrate 100 is etched by a predetermined depth, thereby forming a semiconductor pattern 100a. The semiconductor pattern 100a, the barrier pattern 105a, and the non-single crystal semiconductor pattern 110a, which are sequentially stacked, constitute a preliminary active pattern 115a". In the present embodiment unlike the embodiment illustrated in FIG. 3, the preliminary active pattern 115a" may be formed to further include the semiconductor pattern 100a compared to the preliminary active pattern 115a of FIG. 3. Then, a sacrificial non-single crystal semiconductor layer 120 is formed to cover the preliminary active pattern 115a" and the semiconductor substrate 100.

Figure 10:
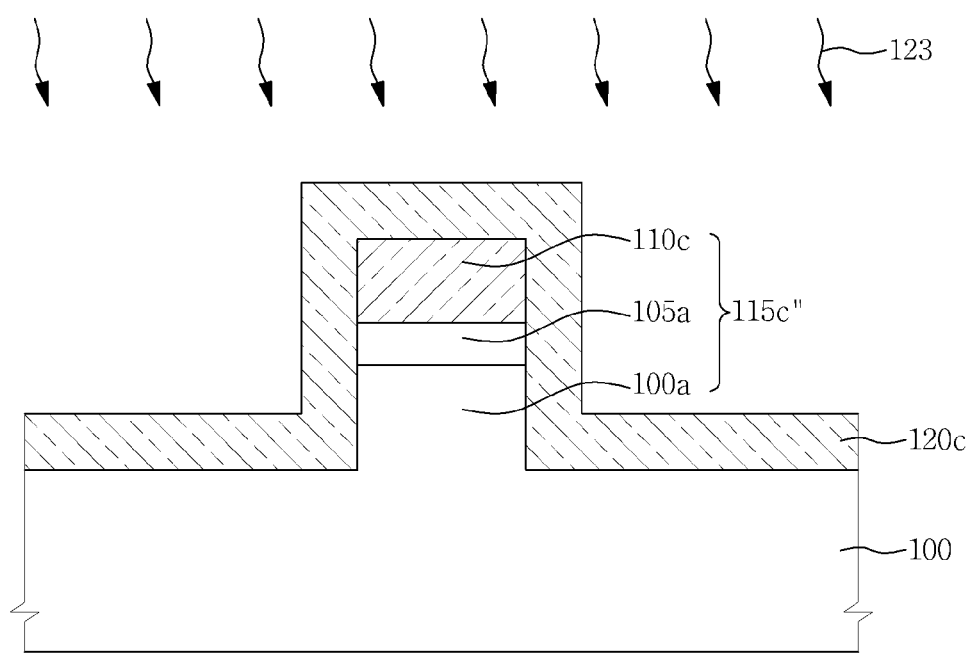

Referring to FIGS. 1, 10, and 11, the semiconductor substrate 100 having the sacrificial non-single crystal semiconductor layer 120 is thermally treated 123. The non-single crystal semiconductor pattern 110a and the sacrificial non-single crystal semiconductor layer 120 are changed to a crystalline semiconductor pattern 110c and a sacrificial crystalline semiconductor layer 120c respectively during the thermal treatment 123. In the embodiments as described above, when the semiconductor substrate 100 has a single crystal structure, the sacrificial non-single crystal semiconductor layer 120 and the non-single crystal semiconductor pattern 110a are crystallized to have substantially the same crystal structure as that of the semiconductor substrate 100, that is, a single crystal structure. After the thermal treatment 123, the preliminary active pattern 115a" is changed to an active pattern 115c". Then, the sacrificial crystalline semiconductor layer 120c is selectively removed. An isolation layer 131" may be formed on the semiconductor substrate 100 around the active pattern 115c". The isolation layer 131" may be formed to expose sidewalls of the semiconductor pattern 100a, the barrier pattern 105a, and the crystalline semiconductor pattern 110c.

Referring to FIGS. 1, 12, and 13, a gate insulating layer 133 is formed on a sidewall of the semiconductor pattern 100a, a sidewall of the crystalline semiconductor pattern 110c, and an upper surface of the crystalline semiconductor pattern 110c. The gate insulating layer 133 may be formed of a thermal oxide layer. A gate electrode 135 and a gate capping pattern 145 are sequentially formed on the gate insulating layer 133 to cross the active pattern 115c". The gate insulating layer 133, the gate electrode 135, and the gate capping pattern 145 constitute a gate pattern 150.

First and second sources 160a and 160a", and first and second drains 160b and 160b" are formed inside the active pattern 115c" on both sides of the gate pattern 150. The first source 160a and the first drain 160b may be formed inside the crystalline semiconductor pattern 110c. The second source 160a" and the second drain 160b" may be formed inside the semiconductor pattern 100a. In this case, the first source 160a and the first drain 160b may be formed to have a conductivity type identical to that of the second source 160a" and the second drain 160b" or different conductivity type from that of the second source 160a" and the second drain 160b".

Hereinafter, a structure of a semiconductor device according to embodiments of the present invention will be explained in reference to FIGS. 1, 7, 8, 12 and 13.

Referring to FIGS. 1 and 7, a semiconductor substrate 100 is provided. The semiconductor substrate 100 may have a single crystal structure. The semiconductor substrate 100 may be a silicon substrate, a germanium substrate, a silicon germanium substrate, or a silicon carbide substrate. An active pattern 115c is disposed on the semiconductor substrate 100. The active pattern 115c includes a barrier pattern 105a and a crystalline semiconductor pattern 110c, which are sequentially stacked. The crystalline semiconductor pattern 110c has substantially the same crystal structure as that of the semiconductor substrate 100. The barrier pattern 105a may be an insulating pattern. The insulating pattern may be a silicon oxide pattern, a silicon nitride pattern, an ONO pattern, or a high-k dielectric pattern. The barrier pattern 105a may have a thickness of about 100 Å or less. The barrier pattern 105a and the crystalline semiconductor pattern 110c are stacked one on top of the other, and, further, may be alternately stacked repetitively.

An isolation layer 131 may be formed on the semiconductor substrate 100 around the active pattern 115c. The isolation layer 131 may include an isolation insulating layer 130 and a liner insulating layer 125 surrounding the isolation insulating layer 130. An upper surface of the isolation layer 131 may be disposed at substantially the same level as that of an upper surface of the active pattern 115c, or may be disposed at the level higher or lower than that thereof.

A gate pattern 150 is disposed to cross the active pattern. The gate pattern 150 may include a gate insulating layer 133, a gate electrode 135, and a gate capping pattern 145, which are sequentially stacked. The gate insulating layer 133 may be a thermal oxide layer.

When the upper surface of the isolation layer 131 is disposed lower than the upper surface of the active pattern 115c, the active pattern 115c may be formed to have a fin-shaped structure. That is, a sidewall of the active pattern 115c may overlap the gate pattern 150. On the contrary, when the upper surface of the isolation layer 131 is disposed higher than the upper surface of the active pattern 115c, the gate electrode 135 may be disposed to be self-aligned. A source 160a and a drain 160b may be disposed inside the active pattern 115c at both sides of the gate pattern. Specifically, the source 160a and the drain 160b may be disposed inside the crystalline semiconductor pattern 110c.

Referring to FIG. 8, a semiconductor device according to another embodiment of the present invention will be explained. First, a semiconductor substrate 100 is provided. An active pattern 115c' is disposed on the semiconductor substrate 100. The active pattern 115c' includes a barrier pattern 105a and a crystalline semiconductor pattern 110c', which are sequentially stacked. The barrier pattern 105a may include a metal pattern. The crystalline semiconductor pattern 110c' may include an n-type semiconductor pattern 110n having n-type impurities, and a p-type semiconductor pattern 110p disposed on the n-type semiconductor pattern 110n and having p-type impurities. In this case, the crystalline semiconductor pattern 110c' may function as a diode. An insulating interlayer 132 is disposed on the semiconductor substrate 100 having the crystalline semiconductor pattern 110c'.

A data storage element 175 electrically connected to the active pattern 115c' is disposed on the insulating interlayer 132. The data storage element 175 may include a phase change material pattern or a magnetic tunnel junction structure.

Referring to FIGS. 1, 12 and 13, a semiconductor device according to another embodiment of the present invention will be explained. An active pattern 115c" is disposed on the semiconductor substrate 100. The active pattern 115c" includes a semiconductor pattern 100a, a barrier pattern 105a, and a crystalline semiconductor pattern 110c, which are sequentially stacked. In the present embodiment unlike the embodiment illustrated in FIG. 7, the semiconductor pattern 100a is disposed below the barrier pattern 105. The semiconductor pattern 100a may have substantially the same crystal structure as that of the semiconductor substrate 100. An isolation layer 131" may be disposed on the semiconductor substrate 100 around the active pattern 115c".

A gate pattern 150 is disposed to cross the active pattern 115c". The gate pattern 150 may include a gate insulating layer 133, a gate electrode 135, and a gate capping pattern 145, which are sequentially stacked. The gate pattern 150 may be disposed to overlap a sidewall of the active pattern 115c" as well as an upper surface thereof.

First and second sources 160a and 160a", and first and second drains 160b and 160b" may be provided inside the active pattern 115c" on both sides of the gate pattern 150. The first source 160a and the first drain 160b may be formed inside the crystalline semiconductor pattern 110c. The second source 160a" and the second drain 160b" may be disposed inside the semiconductor pattern 100a. In this case, the first source 160a and the first drain 160b may have conductivity type identical to that of the second source 160a" and the second drain 160b" or different conductivity type from that thereof. As a result, a plurality of transistors may be provided. Particularly, when the first source 160a and the first drain 160b have different conductivity type from that of the second source 160a" and the second drain 160b", the semiconductor device may function as a CMOS device.

Figure 14:
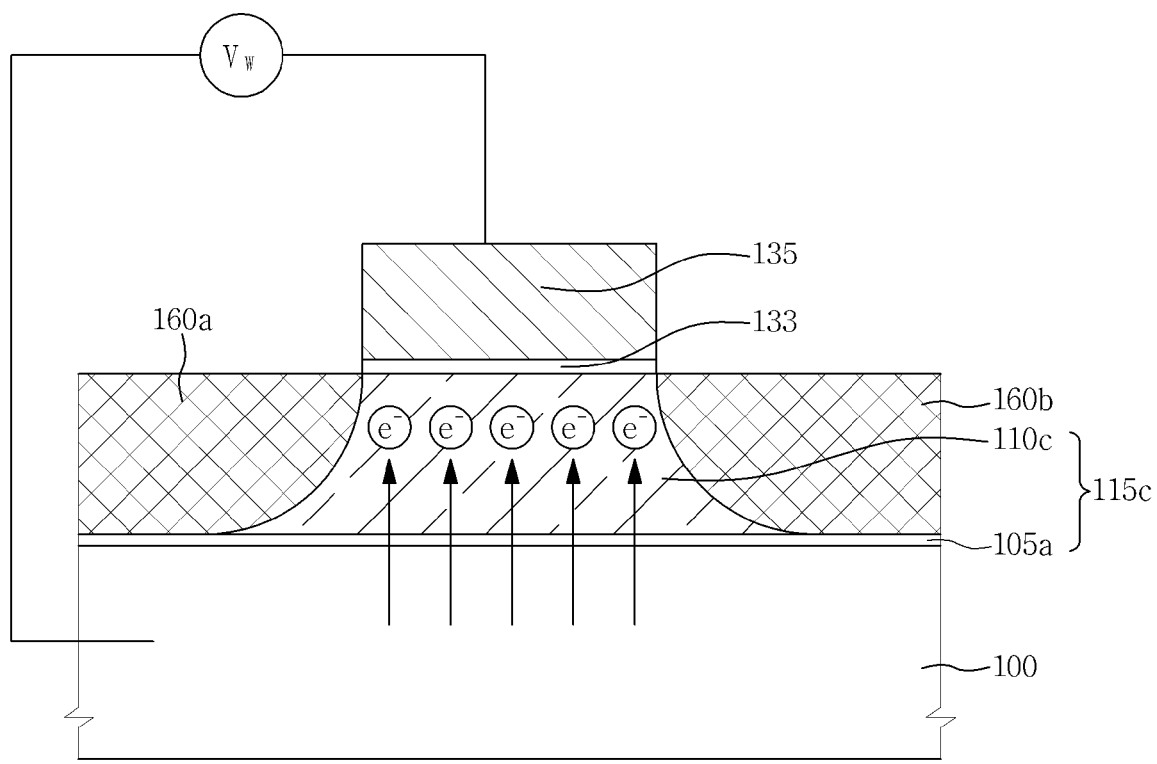
FIGS. 14 and 15 are cross-sectional views taken along line II-II' of FIG. 1 illustrating a method of driving a memory cell of one transistor according to still other embodiments of the present invention.
Figure 15:
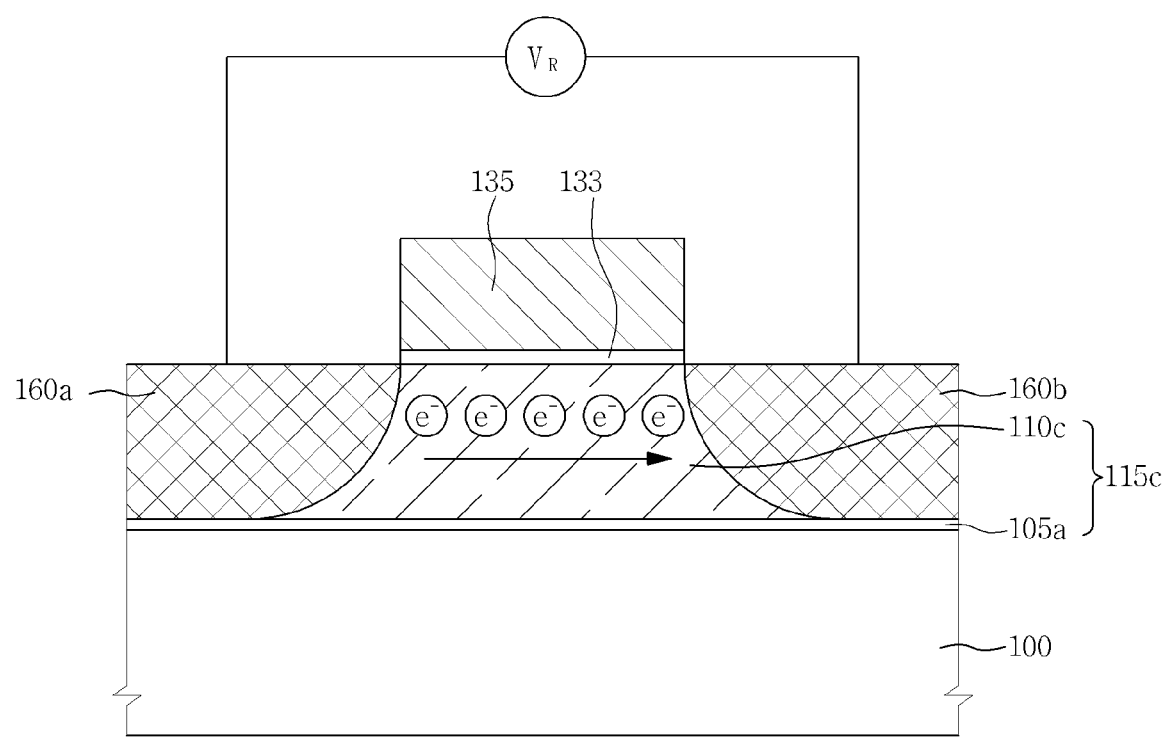

FIGS. 14 and 15 are cross-sectional views taken along line II-II' of FIG. 1 illustrating a one-transistor memory device fabricated according to an embodiment of the present invention, and a method of driving the same.

Referring to FIGS. 1, 14 and 15, an active pattern 115c is disposed on a semiconductor substrate 100. The active pattern 115c may include a barrier pattern 105a and a crystalline semiconductor pattern 110c, which are sequentially stacked. The barrier pattern 105a may be a tunnel insulating layer. A gate insulating layer 133 is disposed on the active pattern 115c. The barrier pattern 105a may be thinner than that of the gate insulating layer 133 such that the barrier pattern 105a can function as a tunnel insulating layer. The barrier pattern 105 may have a thickness of about 100 Å or less. A gate electrode 135 is disposed on the gate insulating layer 133. A source 160a and a drain 160b are disposed inside the crystalline semiconductor pattern 110c on both sides of the gate electrode 135.

A transistor illustrated in FIGS. 1, 14 and 15 may be used as a one-transistor memory, e.g., DRAM cell without a cell capacitor. A method of driving the one-transistor DRAM device with the one-transistor DRAM cell will be explained.

Data corresponding to logic '0' is assumed as an initial state, and a write voltage Vw is applied between the gate electrode 135 and the semiconductor substrate 100 to write data corresponding to logic '1' to the DRAM cell so that carriers are moved from the semiconductor substrate 100 to the crystalline semiconductor pattern 110c by tunneling. That is, by grounding the semiconductor substrate 100 and applying a positive write voltage Vw to the gate electrode 135, electrons are tunneled from the semiconductor substrate 100 to the crystalline semiconductor pattern 110c. As a result, a channel region formed inside the crystalline semiconductor pattern 110c has different potentials in a logic state '0' and a logic state '1'. At this time, the source 160a and the drain 160b may be grounded or may be floated.

To read data of the DRAM cell, a read voltage VR is applied between the source 160a and the drain 160b, to read out data stored in the one-transistor memory cell. The read voltage VR may be in a range of about 0.5 V to 2.0 V.

According to some embodiments of the present invention, the barrier pattern 105a may be formed thinner than a buried insulating layer employed to a conventional SOI substrate. That is, since the barrier pattern 105a is formed relatively thin, it may function as a tunnel insulating layer. As a result, desired data can be stored by tunneling carriers when driving a one-transistor memory cell.

According to some embodiments of the present invention as described above, an active semiconductor layer having substantially the same crystal structure as that of a semiconductor substrate may be formed on the semiconductor substrate. Furthermore, various applicable devices can be fabricated by appropriately selecting a kind and a thickness of a barrier layer interposed between the semiconductor substrate and the active semiconductor layer.

While this general inventive concept has been described in terms of several preferred embodiments, there are alternations, permutations, and equivalents, which fall within the scope of this invention. It should also be noted that there are many alternative ways of implementing the methods and apparatuses of the present general inventive concept. It is therefore intended that the following appended claims be interpreted as including all such alternations, permutations, and equivalents as falling within the true spirit and scope of the present disclosure.

What is claimed is:

1. A semiconductor device comprising:
   a semiconductor substrate having a protruding portion from a top surface of the semiconductor substrate;
   an active pattern on the protruding portion, the active pattern comprising a barrier pattern and a single crystalline semiconductor pattern on the barrier pattern;
   an insulating isolation layer on the semiconductor substrate; and
   a gate pattern on a top surface and sidewalls of the active pattern and on the top surface of the insulating isolation layer, the gate pattern crossing above the active pattern.

2. The semiconductor device according to claim 1, wherein the insulating isolation layer is formed on portions of the sidewalls of the protruding portion.

3. The semiconductor device according to claim 2,
wherein a tope surface of the insulating isolation layer is disposed lower than a top surface of the barrier pattern.

4. The semiconductor device according to claim 3,
wherein the gate pattern is disposed on a portion of sidewalls of the single crystalline semiconductor pattern.

5. The semiconductor device according to claim 4,
wherein the gate pattern comprises a gate insulating layer and a gate electrode on the gate insulating layer.

6. The semiconductor device according to claim 5,
wherein the gate insulating layer is formed on sidewalls of the protruding portion.

7. The semiconductor device according to claim 6,
wherein the gate electrode is formed on sidewalls of the protruding portion.

8. The semiconductor device according to claim 1,
wherein a top surface of the insulating isolation layer is disposed lower than a bottom surface of the barrier pattern.

9. The semiconductor device according to claim 1,
wherein the barrier pattern is made of insulating materials.

10. The semiconductor device according to claim 1,
wherein the semiconductor substrate and the single crystalline semiconductor pattern have the same single crystalline structures.

11. The semiconductor device according to claim 1,
wherein the active pattern and the protruding portion are island shapes.

12. The semiconductor device according to claim 11,
wherein sidewalls of the single crystalline semiconductor pattern and sidewalls of the protruding portion are aligned on a line.

* * * * *